United States Patent [19]
Abraham

[11] Patent Number: 5,772,906
[45] Date of Patent: Jun. 30, 1998

[54] MECHANISM FOR UNIFORM ETCHING BY MINIMIZING EFFECTS OF ETCH RATE LOADING

[75] Inventor: Susan C. Abraham, San Jose, Calif.

[73] Assignee: LAM Research Corporation, Fremont, Calif.

[21] Appl. No.: 652,718

[22] Filed: May 30, 1996

[51] Int. Cl.$^6$ .................................................. H01L 21/306
[52] U.S. Cl. .............................. 216/72; 216/67; 438/714; 438/740
[58] Field of Search .................... 216/72, 67; 156/643.1, 156/646.1, 651.1

[56] References Cited

U.S. PATENT DOCUMENTS

| | | | |
|---|---|---|---|
| 4,980,018 | 12/1990 | Mu et al. | 156/643.1 |
| 5,256,245 | 10/1993 | Keller et al. | 156/643.1 |
| 5,326,427 | 7/1994 | Jerbic | 156/643 |
| 5,411,631 | 5/1995 | Hori et al. | 216/72 |
| 5,429,070 | 7/1995 | Campbell et al. | 118/723 |
| 5,540,812 | 7/1996 | Kadomura | 156/652.1 |
| 5,562,801 | 10/1996 | Nulty | 156/643.1 |
| 5,620,615 | 4/1997 | Keller | 438/720 |

OTHER PUBLICATIONS

T. H. Ahn, S. W. Nam, K.J. Min, and C. Chung, "Effect of Residual Gases on Residue Formation during Tungsten/TiN/Ti Etching Using $SF_6$ and $Cl_2$ Gas Chemistry," Jpn. J. Appl. Phys. vol. 33 (1994) pp. L918–L920, Part 2, No. 7A, Jul. 1, 1994.

*Primary Examiner*—R. Bruce Breneman
*Assistant Examiner*—Michael E. Adjodha
*Attorney, Agent, or Firm*—Hickman Beyer & Weaver, LLP

[57] ABSTRACT

A method for etching a layer stack structure on a substrate is provided. The method includes a step of etching the layer stack to a predefined stopping point using a reverse etch rate loading inducing chemistry. The method also includes a step of etching said layer stack through a target layer in the layer stack structure using a natural etch rate loading chemistry.

38 Claims, 7 Drawing Sheets

MECHANISM FOR UNIFORM ETCHING BY MINIMIZING EFFECTS OF ETCH RATE LOADING

BACKGROUND OF THE INVENTION

This invention relates to the fabrication of semiconductor integrated circuits (ICs). More particularly, the present invention relates to a method and an apparatus for obtaining a uniform etch through a portion of a wafer, including an IC's layer stack.

In semiconductor IC fabrication, devices such as component transistors may be formed on a semiconductor wafer or substrate, which is typically made of silicon. Above the wafer, there may be disposed a plurality of layers from which the devices may be fabricated. Metallic interconnect lines, which may be etched from a metal layer disposed above the wafer, may then be employed to couple the devices together to form the desired circuit. To facilitate this discussion, FIG. 1 illustrates a cross-sectional view of a layer stack 20, representing the layers of an exemplar semiconductor IC. In the discussions that follow, it should be noted that other additional layers above, below, or between the layers shown may be present. Further, not all of the shown layers need necessarily be present and some or all may be substituted by other different layers.

At the bottom of layer stack 20, there is shown a wafer 100. An oxide layer 102, typically comprising $SiO_2$, may be formed above wafer 100. A barrier layer 104, typically formed of a titanium-containing layer such as Ti, TiW, TiN or other suitable barrier materials, may be disposed between oxide layer 102 and a subsequently deposited metal layer 106. Barrier layer 104, when provided, functions to prevent the diffusion of silicon atoms from oxide layer 102 into the metal layer. Metal layer 106 typically comprises, for example, copper, aluminum or one of the known aluminum alloys such as Al-Cu, Al-Si or Al-Cu-Si.

The remaining two layers of FIG. 1, i.e., an anti-reflective coating (ARC) layer 108 and an overlaying photoresist (PR) layer 110, may then be formed atop metal layer 106. The ARC layer 108, typically comprising another titanium-containing layer such as TiN or TiW, may help prevent light (e.g., from the lithography step that patterns the photoresist) from being reflected and scattered off the surface of the metal layer 106 and may, in some cases, inhibit hillock growth. Photoresist layer 110 represents a layer of conventional photoresist material, which may be patterned for etching, e.g., through exposure to ultra-violet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metal layer, e.g., metal layer 106, is etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using appropriate etchants, the areas of the metal layer that are unprotected by the mask may then be etched away, leaving behind metal interconnect lines or features. For illustration purposes, FIG. 2 shows a cross-sectional view of layer stack 20 of FIG. 1 after conventional etching is completed. In this example, the metallic interconnect lines are represented by the unetched portions of metal layer 106.

To achieve greater circuit density, modern IC circuits are scaled with increasingly narrower design rules. As a result, the feature sizes, i.e., the width of the interconnect lines or the spacings (e.g., trenches) between adjacent interconnect lines, have steadily decreased. By way of example, while a line width of approximately 0.8 microns ($\mu m$) may be considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a uniform etch rate across the wafer. The uniformity in etch rate is at least in part dictated by the type of chemistry employed during etching. In the prior art, etching may be performed using a chemistry which consists of an etchant chemical and an inhibitor. The etchant chemical may be responsible for the actual etching or material removal. The inhibitor, typically a polymer forming compound, may help slow down the etching process. It is believed that the use of a polymer-forming agent micromasks the wider spaces, i.e. causing masking polymers to be deposited in the open areas at a faster rate than in the narrow spacings, and thereby reduces the etching rate in the open areas relative to the etching rate in the narrow spacings.

In prior art etches, a single etching chemistry is typically employed to etch through the metal layer. In this single etching chemistry, either the effect of the etchant chemical dominates or the effect of the inhibitor dominates. When the effect of the etchant chemical dominates, the etch rate in the narrow spacings is typically faster. When the effect of the inhibitor dominates, the etching rate in the wider, open areas is typically faster.

The phenomenon where the etch gate in the narrow spacings tends to be slower than that in the wider, open field regions is referred to as natural etch rate loading. In contrast, when the etch rate in the wider, open field regions tends to be slower than that in the narrow spacings is referred to as reverse etch rate loading.

Natural etch rate loading may be a consequence of microloading and aspect ratio dependent etching (ARDE). Microloading refers primarily to the situation wherein the etch rate is lower in areas where there is a high density of line spacings relative to the etch rate of identically sized trenches located in a less dense area. ARDE, on the other hand, refers primarily to the situation wherein variations in etch rates among trenches that are located in areas of similar trench density and among trenches that have different aspect ratios. The loading in etch rates causes trenches to be formed-in the layer stack at different rates. The loading in etch rates tends to become more severe when trench widths fall below about 0.5 microns, and especially when trench widths fall below about 0.35 microns. As a result of the etch rate variations, by the time metal etching is complete in areas having a slow etch rate (e.g., in the narrower line spacings), overetching, i.e., the inadvertent removal of materials from underlying layers, may already occur in areas having a higher etch rate (e.g., the open field regions).

With reference to FIG. 2, area 120 represents the open field region where the metal layer is overetched (by distance d1), and area 122 represents the narrow spacing areas, where the metal layer is underetched (by distance d2). If the natural etch rate variations are sufficiently large, it may not be possible, for some geometry, to etch though the target layer, e.g., the metal layer, in the narrower spacings before undue damage to the underlying layers in the open field regions occurs. For example, large etch rate variations may cause undue overetching and excessive oxide loss in area 120, rendering the wafer undergoing processing unsuitable for use in IC fabrication.

Now referring to FIG. 3, which shows the phenomenon of reverse etch rate loading in a typical semiconductor IC layer stack. Area 120 represents the open field region where the metal layer is underetched (by distance d3), and area 122 represents the narrow spacing, where the metal layer is overetched (by distance d4). If the etch rate variations are sufficiently large, it may not be possible, for some geometry, to etch through the target layer in the open field regions before undue damage to the underlying layers in the narrow spacings occurs.

It should be appreciated by those skilled in the art that either of these effects is undesired as either results in a nonuniform etch. In view of the foregoing, what is desired is a method of uniformly etching through an IC layer stack by minimizing the effects of natural etch rate loading and reverse etch rate loading during IC fabrication.

SUMMARY OF THE INVENTION

The present invention relates, in one embodiment, to a method for uniformly etching a layer stack structure on a substrate. The method includes the step of etching the layer stack to a predefined stopping point using a reverse etch rate loading inducing chemistry. Further, there is included the step of etching the layer stack through a target layer in the layer stack structure using a natural etch rate loading chemistry.

The method may further include the step of etching a first layer underlying the target layer using a third chemistry. The third chemistry may be employed to etch the first layer and preferably stop before etching through an oxide layer underlying the first layer.

The reverse etch rate loading inducing chemistry includes a mixture of an etchant chemical and optionally an inhibitor. The inhibitor is present in the mixture in sufficient amount to induce reverse etch rate loading. The etchant chemical may include $Cl_2$ or $SF_6$ and the inhibitor may include at least one or more selected from the group consisting essentially of $N_2$, $BCl_3$, $CHF_3$ and a compound containing fluorine. The reverse etch rate loading inducing chemistry further may include a chemical for narrowing ion scattering, which may include for example a heavy halogen compound, freon, argon or some other noble gas.

The natural etch rate loading chemistry includes a mixture of an etchant chemical and an inhibitor. The etchant chemical is present in the mixture in sufficient amount to cause natural etch rate loading. In the natural etch rate loading chemistry, like the reverse etch rate loading chemistry, the etchant chemical may include $Cl_2$ or $SF_6$ and the inhibitor may include at least one or more selected from the group consisting essentially of $N_2$, $BCl_3$, $CHF_3$ and a compound containing fluorine. The natural etch rate loading chemistry may further include a chemical for narrowing ion scattering, which may include for example a heavy halogen compound, freon or a noble gas.

These and other features of the present invention will be described in more detail below in the detailed description of the invention and in conjunction with the following figures.

DETAILED DESCRIPTION OF THE PREFERRED EMBODIMENTS

An invention is described for achieving a uniform etch during the etching of an IC's layer stack. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
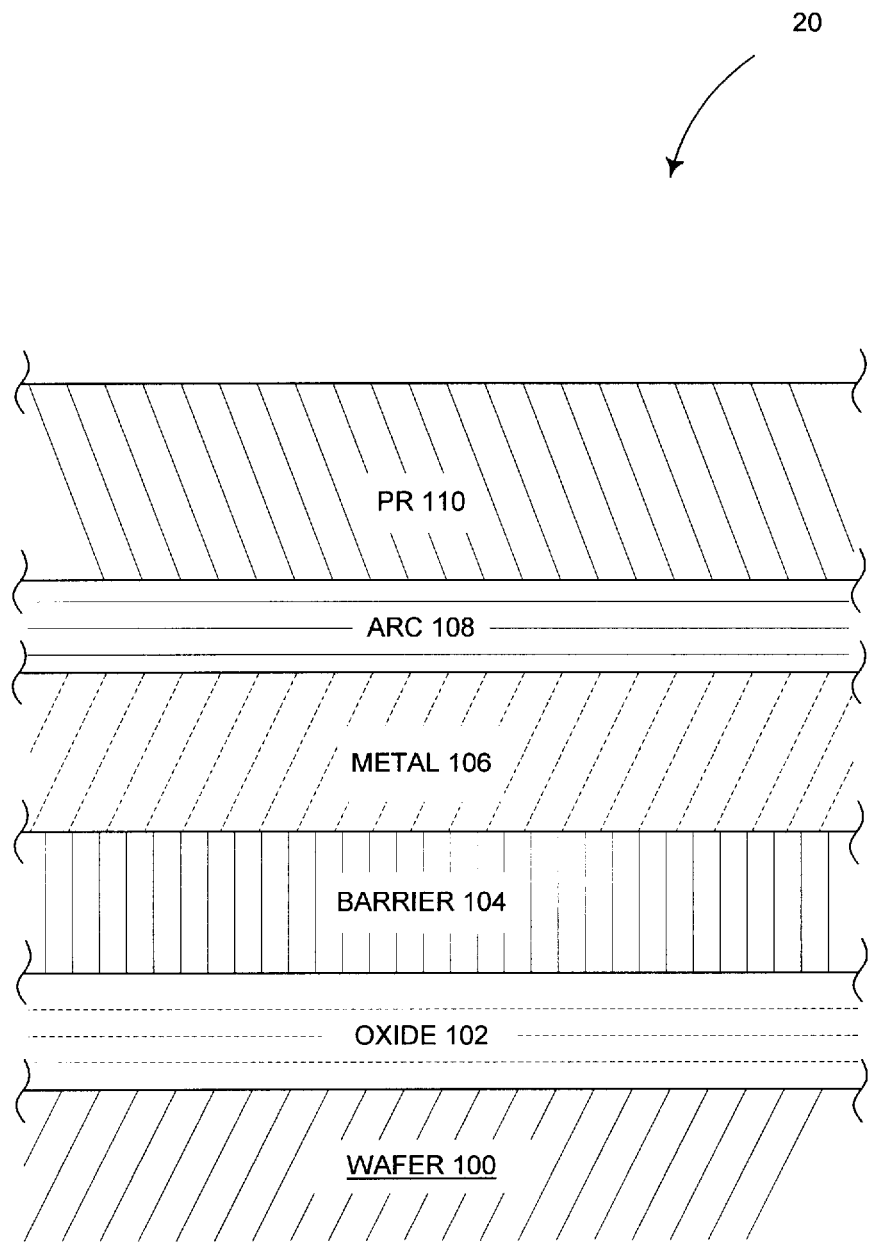
FIG. 1 illustrates a cross-sectional view of a layer stack, representing layers formed during the fabrication of a typical semiconductor integrated circuit (IC) device.
Figure 2:
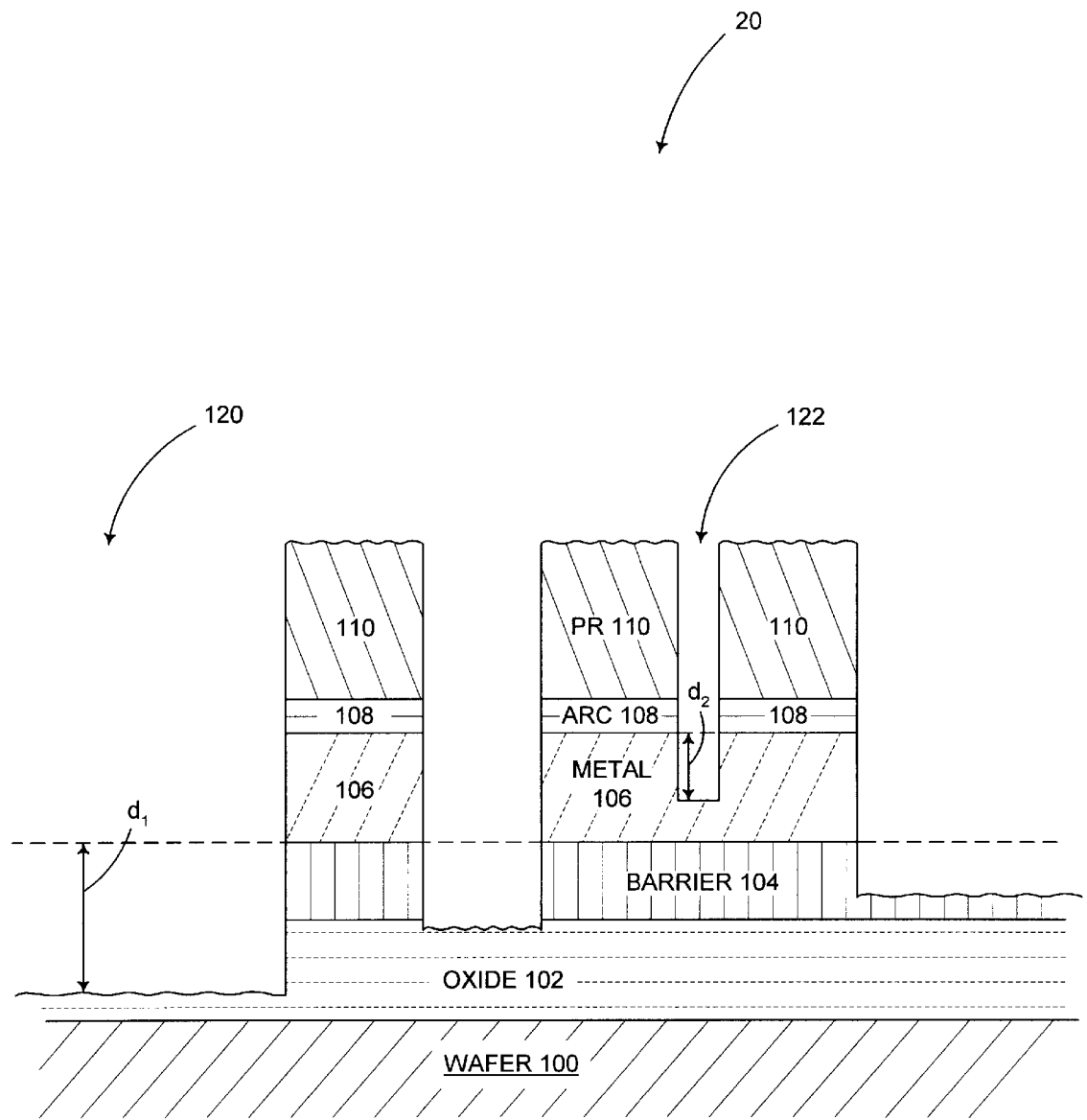
FIG. 2 illustrates a cross-sectional view of the layer stack of FIG. 1, showing the effects of natural etch rate loading.
Figure 3:
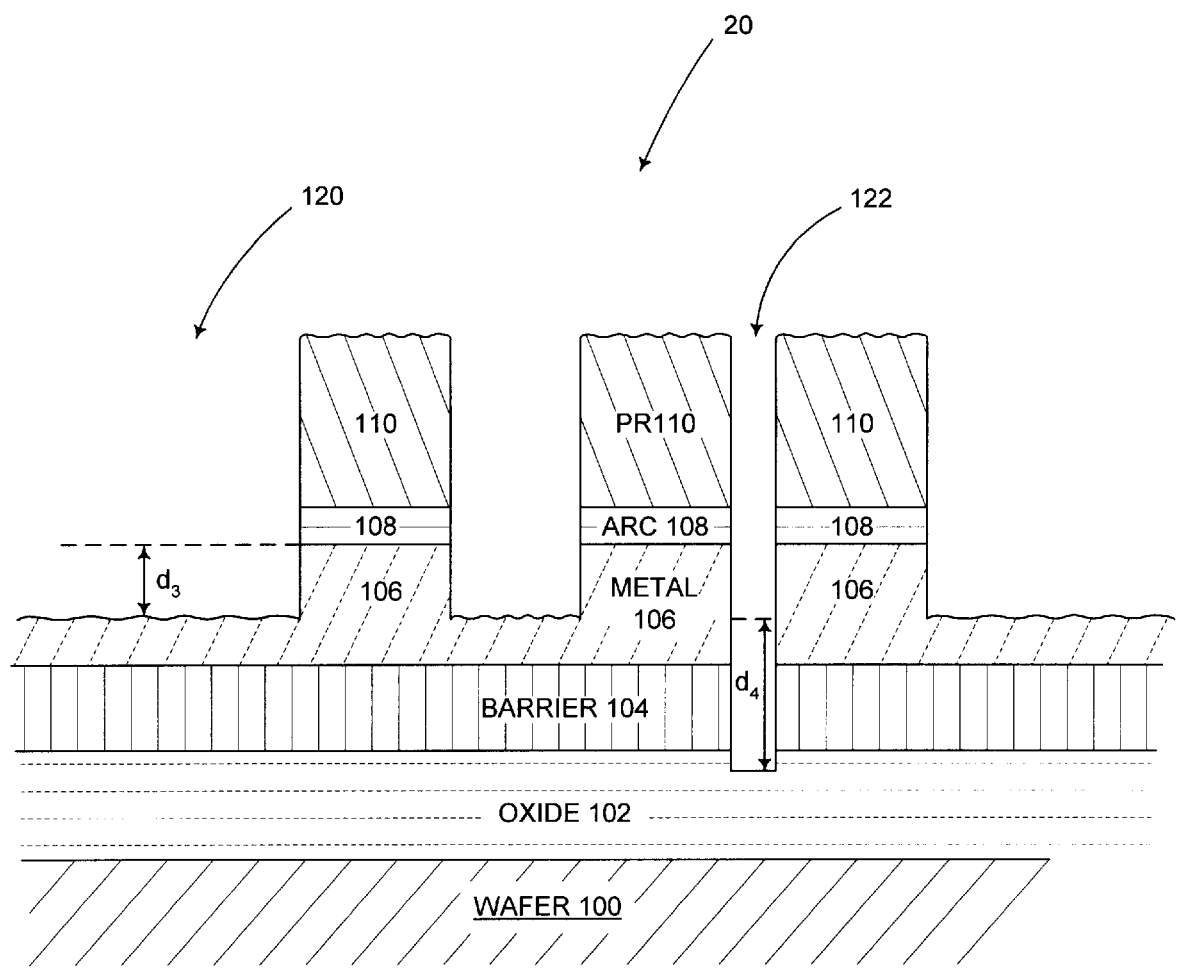
FIG. 3 illustrates a cross-sectional view of the layer stack of FIG. 1, showing the effects of reverse etch rate loading.

In accordance with one aspect of the present invention, the aforementioned non-uniform etching problem may be alleviated by etching a layer stack, such as the IC's layer stack shown in FIG. 1, using two different chemistries. One chemistry preferably includes a reverse etch rate loading chemistry, e.g., one in which the inhibitor component of the chemistry has a dominant effect over the etchant chemical during etching. As such, the etch rate of the wide, open areas tends to be slower than the etch rate in the narrow spacings. The other chemistry preferably represents a chemistry that causes natural etchant rate loading, e.g., one in which the jet ant chemical in the chemistry has a dominant effect over the inhibitor during etching. By the complementary effect of the two chemistries, the inventive process, thus, provides a more uniform etching result.

The inventive two-chemistry etch process may be performed in any of the known plasma processing apparatuses, including those adapted for dry etching, plasma etching, reactive ion etching (I), magnetically enhanced reactive ion etching (MERIE), or the like. To further elaborate, in a typical plasma processing chamber adapted for dry etching, the wafer is treated with plasma. The chamber includes an inlet port through which process etchant source gases are supplied to the chamber interior. A suitable RF energy source, e.g., an RF energy source, is applied to electrodes associated with the chamber to induce plasma. The energy itself may be coupled inductively or capacitively to sustain the plasma, as is known. Species are then formed from the etchant source gas to react with the wafer and etch away at the plasma-contacting layer of the wafer layer stack. The by-products, which maybe volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true, irrespective of whether energy to the plasma is delivered through capacitively coupled parallel electrode plates, through electron cyclotron resonance (ECR) microwave plasma sources, through inductively coupled RF sources such as helicon, helical resonators, and transformer coupled plasma (TCP). ECR and TCP plasma processing systems, among others, are available from Lam Research Corporation of Fremont, Calif.

Figure 4:
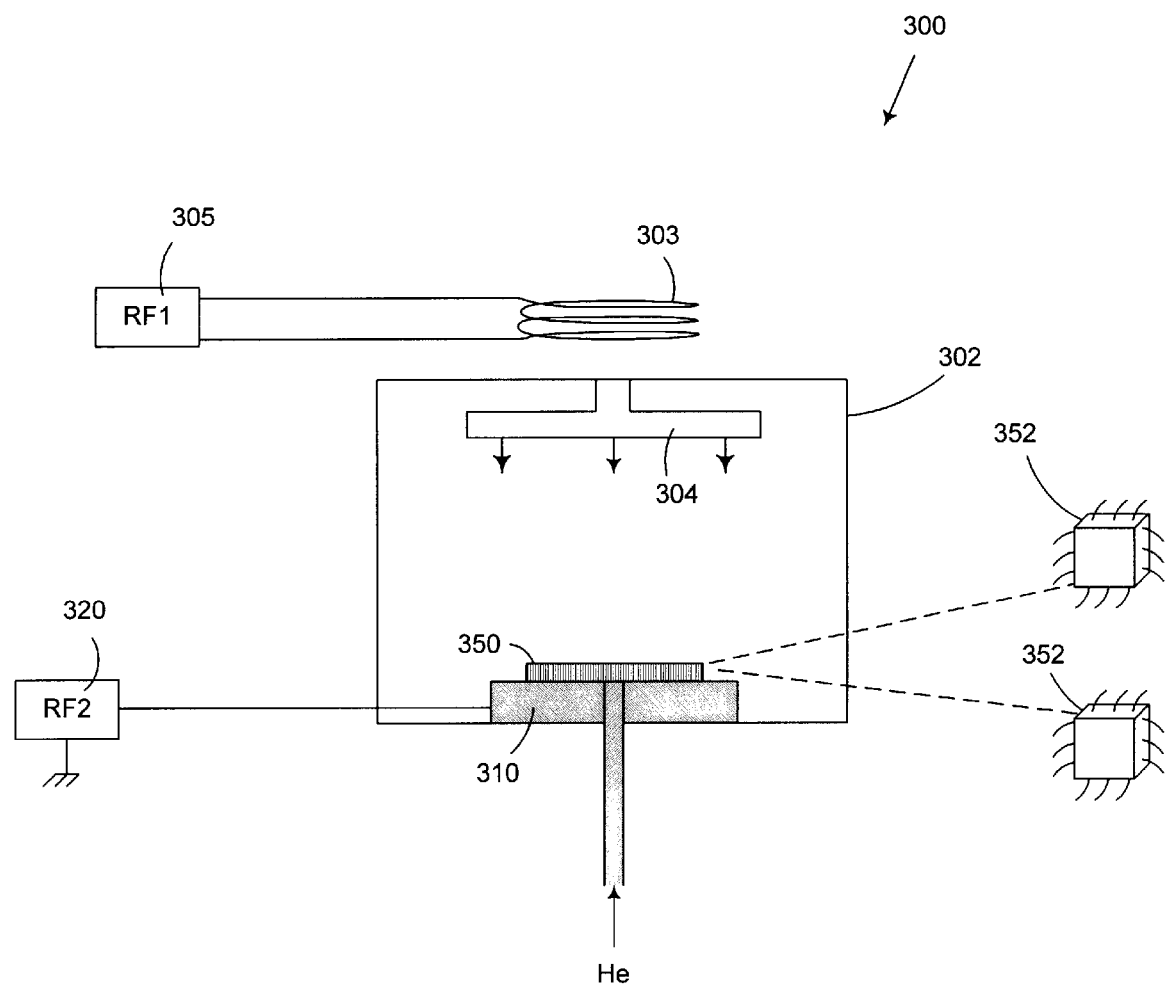
FIG. 4 is a simplified diagram of a plasma reactor that may be suitably employed with the inventive uniform etching method.

In a preferred embodiment, the present invention is employed in a TCP™ 9600 SE plasma reactor, which is available from Lam Research Corporation, although, as mentioned above, any other conventional and suitable plasma processing systems may well be employed. FIG. 4 illustrates a simplified schematic of the TCP™ 9600 SE plasma reactor, including wafer 350 and integrated circuit chips 352, which are fabricated from dies cut from wafer 350 after the wafer is etched according to the inventive etch and processed in conventional post-etch steps. Referring to FIG. 4, a wafer reactor 300 includes a plasma processing chamber 302. Above chamber 302, there is disposed an electrode 303, which is implemented by a coil in the example of FIG. 1. Coil 304 is energized by a RF generator 305 via a matching network (not shown in FIG. 4).

Within chamber 302, there is provided a shower head 304, which preferably includes a plurality of holes for releasing gaseous source materials, e.g., the etchant source gases, into the RF-induced plasma region between itself and a wafer 350. The gaseous source materials may also be released from ports built into the walls of the chamber itself. Wafer 350 is introduced into chamber 302 and disposed on a chuck 310, which acts as a second electrode and is preferably biased by a radio frequency generator 320 (also typically via a matching network). Helium cooling gas is introduced under pressure (e.g., about 5–10 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low, e.g., between about 8 to 22 mTorr in one embodiment. A plurality of heaters (omitted from FIG. 4 to simplify the illustration) may be provided to maintain a suitable chamber temperature for etching (e.g., about 70° C. in one embodiment). To provide a path to ground, the chamber wall of chamber 302 is typically grounded.

Figure 5:
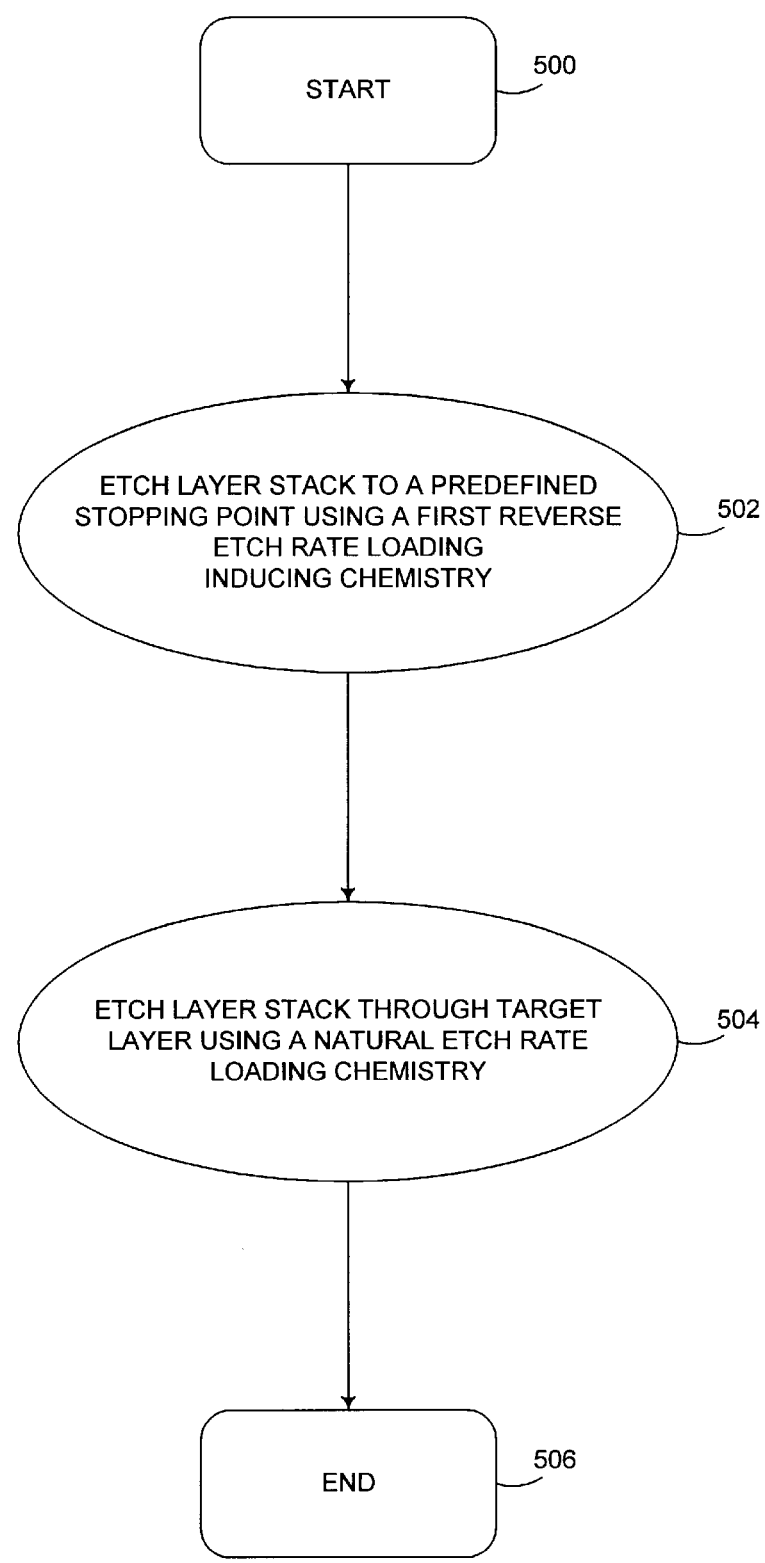
FIG. 5 shows, in accordance with one aspect of the present invention, the steps involved in the inventive uniform etching method.

FIG. 5 shows, in accordance with one aspect of the present invention, the steps involved in the inventive two-chemistry etch process. In step 500, the wafer is prepared for etching in a conventional pre-etch step. The pre-etch step may include, for example, clamping the wafer onto chuck, stabilizing the pressure within the plasma processing chamber, and introducing helium cooling gas to the wafer backside to facilitate heat transfer between the wafer and the chuck. Of course, these pre-etch steps apply when a plasma processing reactor is employed and may differ, as can be appreciated by those skilled in the art, when different types of reactors are involved.

In step 502, etching, preferably using a first chemistry containing a reverse etch rate loading chemistry, begins from the top surface of the layer stack to a predefined stopping point inside the layer stack. The predefined stopping point in step 502 may be a point that is above the target layer i.e., the layer that is the target of the etch. As discussed hereinabove, a reverse etch rate loading chemistry may be a mixture that essentially includes an etchant chemical that is suitable for etching the target layer and an inhibitor. The inhibitor is present in the reverse etch rate loading chemistry preferably in sufficient amount to have a more dominant effect over the etchant chemical to cause etching in the narrow spacings to proceed at a faster rate than that in the open areas.

In one embodiment, the target layer is an aluminum-containing layer. The inhibitor may include at least one or more selected from the group consisting of $N_2$, $BCl_3$, $CHF_3$ and any compound containing fluorine. The etchant chemical may include $Cl_2$ or $SF_6$. The reverse etch rate loading chemistry in step 502 may further include a diluent chemical such as a heavy halogen compound, freon or a noble gas for narrowing ion scattering to assist in the etching process. The diluent may also serve to physically bombard the plasma and thereby enhance the degree of dissociation of the plasma.

In step 504, etching, preferably employing a second chemistry that includes a natural etch rate loading chemistry, proceeds through the remainder of the layer stack at least partially through the target layer. Preferably, however, etching using a natural etch rate loading chemistry proceeds through the target layer. By way of example, where the target layer is the metal layer in a layer stack, etching by natural etch rate loading chemistry preferably proceeds through the metal layer and most preferably, down to an oxide layer, before being terminated. It should be kept in mind that the target layer may of course represent any other layer, e.g., polysilicon or oxide, having a suitable underlying layer.

Although, the natural etch rate loading chemistry may, in one embodiment, include a similar etchant chemical and inhibitor as in the reverse etch rate loading chemistry, the ratio of the amount of the etchant chemical to the amount of the inhibitor present tends to be higher in the natural etch rate loading chemistry relative to the ratio in the reverse etch rate loading chemistry. The etchant chemical is present in the reverse etch rate loading chemistry preferably in sufficient amount to have a dominant effect over the inhibitor to cause the etch to proceed faster in the open areas relevant to the narrow spacings.

In one embodiment, the etchant chemical may include $Cl_2$ or $SF_6$. The inhibitor may include one or more selected from the group consisting of $N_2$, $BCl_3$, $CHF_3$ and any compound containing fluorine. The natural etch rate loading chemistry in step 504 may also include a diluent chemical such as a heavy halogen compound, freon or a noble gas for narrowing ion scattering to assist in the etching process just as in reverse etch rate loading chemistry.

Etching using a natural etch rate loading chemistry, for example in step 504, subsequent to an etch using a reverse etch rate loading chemistry, for example in step 502, tends to produce a complementary effect, which balances out the composite etch rates in the wide open field areas and the narrow spacings. The wide, open areas that were etched at a slower etch rate than the narrow spacings using a reverse etch rate loading chemistry are subsequently etched at a faster rate than the narrow spacings using a natural etch rate loading chemistry. The two chemistries employed in this manner yield the desired more uniform composite etch rate, e.g., the etch rate achieved in steps 502 and 504.

It should be appreciated by those of skill in the art that the inventive method is not limited to performing the reverse etch rate loading chemistry before performing the natural etch rate loading chemistry. Two chemistries could be employed in the reverse order, i.e., the natural etch rate loading chemistry can be employed first, to be followed by an etch employing a reverse etch rate loading chemistry.

Further, it should be kept in mind that the invention is not limited to the etching of the metal target layer or any specific target layer for that matter. Additionally, although the invention is discussed with reference to a multi-layer layer stack, it should be understood that the invention may be employed to etch, using the reverse etch rate loading inducing chemistry and the natural etch loading chemistry in separate steps, a single layer. In other words, the layer stack may comprise a single target layer to be etched by both etching steps.

It is believed that the inventive two-chemistry etch technique may be profitably employed by one skilled in the art to achieve a more uniform composite etch rate while etching through any target layer. The specific chemistries required for inducing the reverse etch rate loading and for producing a natural etch rate loading effect for a particular target layer e.g., polysilicon or oxide may be selected by such a person using knowledge generally possessed by those skilled in the art.

In step 506 of FIG. 5 the wafer may undergo additional post-etch processing steps that are conventional in nature. Thereafter, the finished wafer may be cut into dies, which may then be made into IC chips. The resulting IC chip, e.g., IC chips 352 of FIG. 4, may then be incorporated in an electronic device, e.g., any of the of well known commercial or consumer electronic devices, including digital computers.

Figure 6:
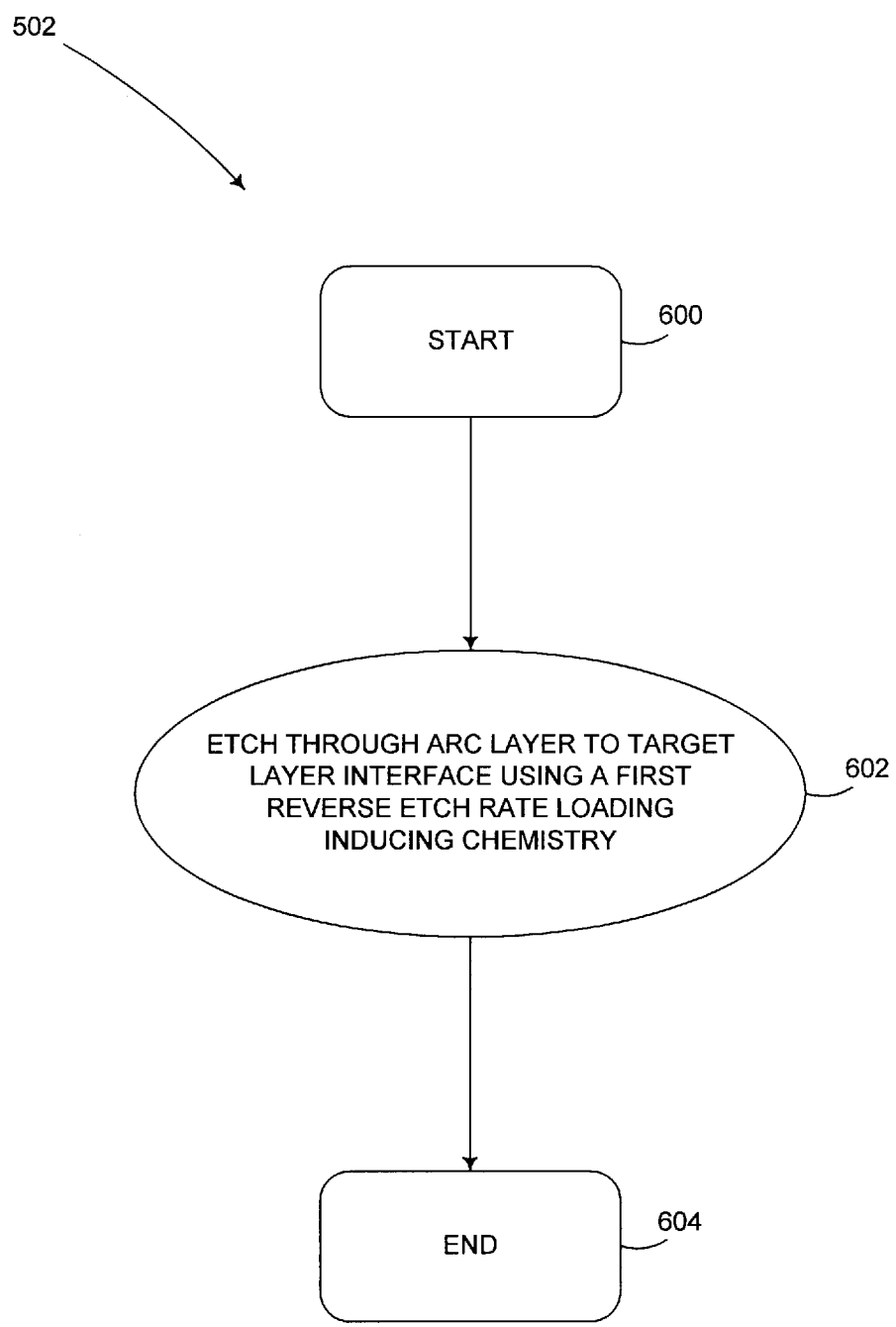
FIG. 6 shows in one embodiment, the steps involved in employing a reverse etch rate loading chemistry to etch the layer stack of FIG. 1.

FIG. 6 shows in another embodiment the steps involved in step 502 of FIG. 5 (etching the target layer to form metal interconnect lines). In the embodiment of FIG. 6, the target layer may include a metal layer, which in this context may include and is not limited to copper, aluminum and aluminum alloys.

In step 602, the layer stack is etched through the ARC layer, which overlies the metal layer, using the reverse etch rate loading inducing chemistry, to a predefined stopping point. In one embodiment, the predefined stopping point lies at about the metal layer/ARC layer interface. In some other embodiments, however, the predefined stopping point may be a point that is located inside the ARC layer, or inside the metal layer itself.

The ARC layer may include, for example, TiN, TiW or a material that is mainly titanium. In one embodiment, the anti-reflective layer is formed of TiN, and endpoint detection is accomplished by optically monitoring the rise of the 703 nm wavelength in the plasma, which indicates that substantially an the TiN anti-reflective layer has been removed. Etching may then terminate immediately or may be allowed to continue for a predetermined period of time, e.g., an additional five seconds, to ensure the complete removal of the TiN anti-reflective layer material. Other conventional methods to determine the termination point for this first chemistry etch step may also be employed.

By way of example, the reverse etch rate loading inducing chemistry for a TiN anti-reflective layer etch may, for example, include any one of the group consisting of $Cl_2/N_2$, $Cl_2/N_2/Ar$, $Cl_2/Ar$, $Cl_2/N_2/HCl$, $Cl_2/HCl$, $Cl_2/N_2/CHF_3$, $Cl_2/CHF_3$, and $Cl_2/Ar/CHF_3$. It is contemplated that the argon in the $Cl_2/Ar/CHF_3$ may be substituted by other noble gases such as helium, krypton, xenon, or the like. $Cl_2/Ar/CHF_3$ also provides other advantageous results, which are discussed in greater detail in a copending, commonly assigned patent application entitled "Methods and Apparatus for Etching Semiconductor Wafers" (Attorney Docket No. P210/LAM014),filed on Feb. 15, 1996 and incorporated herein by reference.

Figure 7:
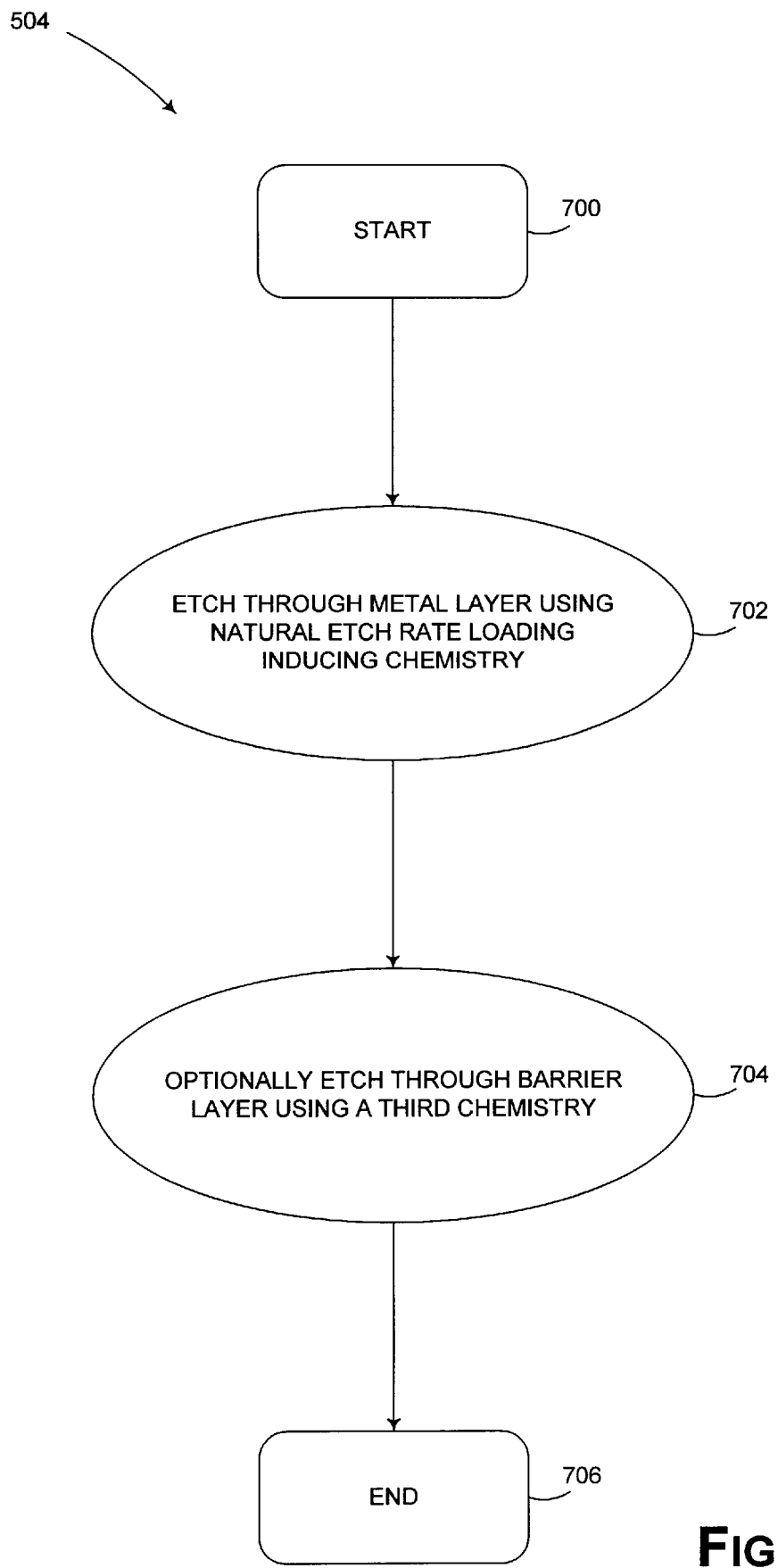
FIG. 7 shows in one embodiment, the steps involved in employing a natural etch rate loading chemistry to etch the layer stack of FIG. 1.

FIG. 7 shows in another embodiment step 504 of FIG. 5. In the embodiment of FIG. 7, the target layer represents a metal layer and one chemistry is employed to etch through the metal target while another chemistry is optionally employed, if desired, to etch through an underlying layer such as a barrier layer before ending the etch on the oxide layer.

In step 702, a natural etch rate loading chemistry is employed to etch through the target layer, e.g., the aluminum or aluminum alloy layer. By way of example, a mixture of $Cl_2/BCl_3/CHF_3$ having a flow volume ratio of 70%:20%:10% respectively has been found to be suitable for etching through an aluminum alloy metal layer having about 0.5%–1% of copper.

In step 704, a third chemistry may optionally be employed to etch through the underlying layer, e.g., a barrier layer which underlies the aluminum metal layer in one embodiment. Etching with the third chemistry may terminate before etching through an oxide layer, which, in turn, may underlie the first underlying layer such as the aforementioned barrier layer in one embodiment. The third chemistry may include either the reverse or natural etch rate loading chemistry, depending on which chemistry is necessary to provide a uniform composite etching rate for the layer stack.

EXAMPLES

In the tables that follow, suitable parameters for etching through an exemplar layer stack are shown. The approximate process parameters have been scaled to a 6" wafer in a TCP™ 9600 SE plasma reactor. In this example, the metal-overlaying layer is a TiN anti-reflection layer, which overlays an aluminum layer containing approximately 0.5% copper. In these tables, an approximate suitable range, an approximate preferred range, and an approximate more preferred range of the top electrode power (in watts), bottom electrode power (in watts), and flow rates (in percentage of total etchant source flow rate unless otherwise specified) are shown. Other parameter values that may be helpful for the etch will be readily apparent to those skilled in the art, whether for the same wafer and anti-reflection layer or other wafers and anti-reflection layers.

Tables 1 and 2 illustrate the approximate suitable parameters for use in step 502. In Tables 1 and 2, the approximate suitable parameters for an etching step using respectively $Cl_2/N_2$ and $Cl_2/Ar/CHF_3$ reverse etch rate loading chemistry were shown. Tables 3 and 4 illustrate the approximate suitable parameters for use in step 504. In Tables 3 and 4, the approximate suitable parameters for an etching step employing respectively $Cl_2/N_2$ and $Cl_2/Ar/CHF_3$ natural etch rate loading chemistry are shown.

The approximate process parameters shown therein are generally suitable for etching a 6-inch wafer on the aforementioned TCP™ 9600 SE plasma reactor. It should be readily apparent and within the skills of one skilled in the art that the parameter may be scaled and/or modified as appropriate to etch a substrate having a different dimension or to conform to the requirements of a specific plasma reactor.

TABLE 1

| REVERSE ETCH RATE LOADING | | TOP POWER (WATTS) | BOTTOM POWER (WATTS) | $Cl_2$ (% of total flow rate) | $N_2$ (% of $Cl_2$ flow rate) | Pressure (mTorr) |
|---|---|---|---|---|---|---|
| $Cl_2/N_2$ | Range | 300–600 | 70–250 | 75%–77% | 12%–50% | 2–100 |
| | Preferred Range | 350–550 | 80–200 | 60%–75% | 25%–40% | 8–60 |
| | More Preferred Range | 450–500 | 100–120 | 65% | 35% | 18 |

TABLE 2

| NATURAL ETCH RATE LOADING CHEMISTRY | | TOP POWER (WATTS) | BOTTOM POWER (WATTS) | $Cl_2$ FLOW RATE (sccm) | $CHF_3$ FLOW RATE (% of $Cl_2$ flow) | Ar FLOW RATE (% of $Cl_2$ flow) | Pressure (mTorr) |
|---|---|---|---|---|---|---|---|
| $Cl_2/Ar/CHF_3$ | Range | 350–650 | 100–350 | 30–110 sccm $Cl_2$ | 12%–50% | 15%–50% | 2–100 |
| | Preferred Range | 400–600 | 120–200 | 35–80 sccm $Cl_2$ | 15%–35% | 25%–40% | 8–60 |
| | More Preferred Range | 560 | 140 | 40 sccm $Cl_2$ | 20% | 38% | 20 |

TABLE 3

| NATURAL ETCH RATE LOADING CHEMISTRY | | TOP POWER (WATTS) | BOTTOM POWER (WATTS) | % $Cl_2$ FLOW RATE OF TOTAL FLOW | % $N_2$ FLOW RATE OF $Cl_2$ FLOW | Pressure (mTorr) |
|---|---|---|---|---|---|---|
| $CL_2/N_2$ | Range | 350–650 | 100–350 | 70%–95% $Cl_2$ | 5%–30% $N_2$ | 2–100 |
| | Preferred Range | 400–600 | 120–200 | 80%–90% $Cl_2$ | 10%–20% $N_2$ | 8–30 |
| | More Preferred Range | 560 | 140 | 83.3% $Cl_2$ | 16.7% $N_2$ | 8 |

TABLE 4

| NATURAL ETCH RATE LOADING CHEMISTRY | | TOP POWER (WATTS) | BOTTOM POWER (WATTS) | $Cl_2$ FLOW RATE (sccm) | $CHF_3$ FLOW RATE (% of $Cl_2$ flow) | Ar FLOW RATE (% of $Cl_2$ flow) | Pressure (mTorr) |
|---|---|---|---|---|---|---|---|
| $Cl_2/Ar/CHF_3$ | Range | 350–650 | 100–350 | 30–110 sccm $Cl_2$ | 12.5%–30% | 19%–50% | 2–100 |
| | Preferred Range | 400–600 | 120–200 | 35–80 sccm $Cl_2$ | 15%–25% | 25%–40% | 8–30 |
| | More Preferred Range | 560 | 140 | 40 sccm $Cl_2$ | 17.5% | 37.5% | 15 |

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching a layer stack structure on a substrate, said method comprising:

etching said layer stack to a stopping point using a reverse etch rate loading inducing chemistry, said reverse etch rate loading inducing chemistry being selected to cause etching to occur faster in a narrow region of said substrate relative to a wide region of said substrate; and etching said layer stack at least partially through a target layer in said layer stack structure using a natural etch rate loading chemistry, said natural etch rate loading inducing relative to said narrow region of said substrate.

2. The method of claim 1, further comprising a step of etching a first layer underling said target layer using a third chemistry.

3. The method of claim 2, wherein said step of etching said first layer stops before etching through an oxide layer underlying said first layer.

4. The method of claim 1 wherein said reverse etch rate loading inducing chemistry comprises an etchant chemical and an inhibitor and wherein said inhibitor is present in sufficient amount to induce reverse etch rate loading.

5. The method of claim 4 wherein said etchant chemical comprises one of $Cl_2$ and $SF_6$ and said inhibitor comprises one or more selected from the group consisting essentially of $N_2$, $BCl_3$, $CHF_3$ and a compound containing fluorine.

6. The method of claim 4 wherein said reverse etch rate loading inducing chemistry comprises a chemical for narrowing ion scattering.

7. The method of claim 6 wherein said chemical for narrowing ion scattering comprises one or more selected from a group consisting of a heavy halogen compound, freon and a noble gas.

8. The method of claim 1 wherein said natural etch rate loading chemistry comprises an etchant chemical and an inhibitor and wherein said etchant chemical is present in sufficient amount to cause natural etch rate loading.

9. The method of claim 8 wherein said etchant chemical comprises one of $Cl_2$ and $SF_6$ and said inhibitor comprises one or more selected from the group consisting essentially of $N_2$, $BCl_3$, $CHF_3$ and a compound containing fluorine.

10. The method of claim 8 wherein said natural etch rate loading chemistry further comprises a chemical for narrowing ion scattering.

11. The method of claim 10 wherein said chemical for narrowing ion scattering comprises one or more selected from a group consisting of a heavy halogen compound, freon and a noble gas.

12. The method of claim 1 wherein said step of etching said layer stack to a stopping point comes before said step of etching said layer stack through a target layer.

13. The method of claim 1 wherein the target layer comprises a material selected from the group consisting of metal polysilicon and an oxide layer.

14. The method of claim 13 wherein the target layer comprises a metal layer.

15. The method of claim 14 wherein the target layer comprises one or more selected from the group consisting of copper, aluminum and aluminum alloy.

16. The method of claim 1 wherein said layer stack further comprises an anti-reflective coating layer disposed above said target layer and said step of etching said layer stack to a stopping point comprises etching through said anti-reflective coating layer to a point that lies near interface between said target layer and said anti-reflective coating layer.

17. The method of claim 16 wherein said stopping point lies in said anti-reflective coating layer.

18. The method of claim 16 wherein said anti-reflective coating layer comprises TiN or TiW.

19. The method of claim 18 wherein said anti-reflective coating layer comprises TiN.

20. The method of claim 1 wherein said method of etching is conducted in a high density parallel plate plasma reactor.

21. The method of claim 1 wherein said method of etching is conducted in a electron capture resonance (ECR) plasma reactor.

22. The method of claim 1 wherein said method of etching is conducted in a transformer coupled plasma reactor.

23. A method for etching a layer stack structure comprising a TiN anti-reflective coating layer and an aluminum alloy metal layer on a substrate, said method comprising:

etching said layer stack through said TiN anti-reflective coating layer to a stopping point in said layer stack structure using reverse etch rate loading inducing chemistry; and etching said layer stack at least partially through said metal layer using a natural etch rate loading chemistry.

24. The method of claim 23 wherein said reverse etch rate loading inducing chemistry comprises one selected from the group consisting of $Cl_2/N_2$, $Cl_2/CHF_3$, $Cl_2/N_2/CHF_3$, and $Cl_2/Ar/CHF_3$.

25. The method of claim 24 wherein said natural etch rate loading chemistry comprises one selected from the group consisting of $Cl_2/BCl_3$, $Cl_2/N_2$, $Cl_2/CHF_3$, $Cl_2/N_2/CHF_3$, and $Cl_2/Ar/CHF_3$.

26. The method of claim 23 wherein said natural etch rate loading chemistry comprises one selected from the group consisting of $Cl_2/BCl_3$, $Cl_2/N_2$, $Cl_2/CHF_3$, $Cl_2/N_2/CHF_3$, and $Cl_2/Ar/CHF_3$.

27. A method for etching a layer stack structure on a substrate, said method comprising:

etching said layer stack using a reverse etch loading inducing chemistry, said reverse etch rate loading inducing chemistry being selected to cause etching to occur faster in a narrow region of said substrate relative to a wide region of said substrate; and etching said layer stack using a natural etch rate loading chemistry, said natural etch rate loading inducing chemistry being selected to cause etching to occur in said wide region of said substrate relative to said narrow region of said substrate.

28. The method of claim 27 wherein said reverse etch rate loading inducing chemistry comprises an etchant chemical and an inhibitor and wherein said inhibitor is present in sufficient amount to induce reverse etch rate loading.

29. The method of claim 28 wherein said etchant chemical comprises one of $Cl_2$ and $SF_6$ and said inhibitor comprises one or more selected from the group consisting essentially of $N_2$, $BCl_3$, $CHF_3$ and a compound containing fluorine.

30. The method of claim 27 wherein said natural etch rate loading chemistry comprises an etchant chemical and an inhibitor and wherein said etchant chemical is present in sufficient amount to cause natural etch rate loading.

31. The method of claim 30 wherein said etchant chemical comprises one of $Cl_2$ and $SF_6$ and said inhibitor comprises one or more selected from the group consisting essentially of $N_2$, $BCl_3$, $CHF_3$ and a compound containing fluorine.

32. The method of claim 27 wherein said step of etching said layer stack using a reverse etch rate loading inducing chemistry comes before said step of etching said layer stack using a natural etch rate loading chemistry.

33. The method of claim 27 wherein said step of etching said layer stack using a natural etch rate loading chemistry comes before said step of etching said layer stack using a reverse etch rate loading inducing chemistry.

34. A method for etching a layer stack structure on a substrate, said method comprising:

etching said layer stack to a stopping point using a natural etch rate loading inducing chemistry, said natural etch rate loading inducing chemistry being selected to cause etching to occur faster in a wide region of said substrate relative to a narrow region of said substrate; and etching said layer stack at least partially through a target layer in said layer stack structure using a reverse etch rate loading chemistry, said reverse etch rate loading inducing chemistry being selected to cause etching to occur faster in said narrow region of said substrate relative to said wide region of said substrate.

35. The method of claim 34 wherein said reverse etch rate loading inducing chemistry comprises an etchant chemical and an inhibitor and wherein said inhibitor is present in sufficient amount to induce reverse etch rate loading.

36. The method of claim 35 wherein said etchant chemical comprises one of $Cl_2$ and $SF_6$ and said inhibitor comprises one or more selected from the group consisting essentially of $N_2$, $BCl_3$, $CHF_3$ and a compound containing fluorine.

37. The method of claim 34 wherein said natural etch rate loading chemistry comprises an etchant chemical and an inhibitor and wherein said etchant chemical is present in sufficient amount to cause natural etch rate loading.

38. The method of claim 37 wherein said etchant chemical comprises one of $Cl_2$ and $SF_6$ and said inhibitor comprises one or more selected from the group consisting essentially of $N_2$, $BCl_3$, $CHF_3$ and a compound containing fluorine.

* * * * *